US012643193B2

(12) United States Patent
Cho

(10) Patent No.: US 12,643,193 B2
(45) Date of Patent: Jun. 2, 2026

(54) CHEMICAL MECHANICAL POLISHING APPARATUS AND METHOD OF CONTROLLING THE SAME

(71) Applicant: Samsung Electronics Co., Ltd., Suwon-si (KR)

(72) Inventor: Wonkeun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/210,819

(22) Filed: Jun. 16, 2023

(65) Prior Publication Data

US 2024/0217059 A1 Jul. 4, 2024

(30) Foreign Application Priority Data

Dec. 28, 2022 (KR) ........................ 10-2022-0187872

(51) Int. Cl.
B24B 37/32 (2012.01)
B24B 37/04 (2012.01)
B24B 37/26 (2012.01)
H10P 52/40 (2026.01)

(52) U.S. Cl.
CPC ............ B24B 37/32 (2013.01); B24B 37/042 (2013.01); B24B 37/26 (2013.01); H10P 52/402 (2026.01)

(58) Field of Classification Search
CPC ..... B24B 7/228; B24B 37/005; B24B 37/015; B24B 37/04; B24B 37/042; B24B 37/07; B24B 37/10; B24B 37/102; B24B 37/105; B24B 37/107
See application file for complete search history.

(56) References Cited

U.S. PATENT DOCUMENTS

| | | | | |
|---|---|---|---|---|
| 5,486,131 A * | 1/1996 | Cesna | ................... | B24B 53/017 451/159 |
| 6,464,574 B1 * | 10/2002 | Halley | ................... | B24D 9/085 451/490 |
| 6,541,397 B1 | 4/2003 | Bencher | | |
| 6,629,882 B2 * | 10/2003 | Takahashi | ............... | B24B 49/12 451/60 |
| 6,648,743 B1 * | 11/2003 | Burke | ..................... | B24B 37/26 451/529 |
| 6,780,092 B2 * | 8/2004 | Yi | ........................ | B24B 49/006 451/388 |

(Continued)

FOREIGN PATENT DOCUMENTS

| | | |
|---|---|---|
| KR | 1020040023888 A | 3/2004 |
| KR | 102144847 B1 | 8/2020 |
| KR | 1020210002464 A | 1/2021 |

*Primary Examiner* — Joel D Crandall
(74) *Attorney, Agent, or Firm* — Muir Patent Law, PLLC

(57) ABSTRACT

The present disclosure relates to a chemical mechanical polishing apparatus and a method of controlling the same, and the chemical mechanical polishing apparatus includes: a polishing pad having a hollow shape and including a plurality of first grooves disposed at an edge of the polishing pad and arranged in a circumferential direction; a substrate support positioned below the polishing pad and including an edge portion that adjoins the plurality of first grooves, the substrate support being configured to mount a wafer; and a slurry supplier positioned above the wafer and configured to supply slurry to the wafer.

20 Claims, 25 Drawing Sheets

(56) References Cited

U.S. PATENT DOCUMENTS

| | | | |
|---|---|---|---|
| 6,905,398 B2* | 6/2005 | Jeong | B24B 41/047 |
| | | | 451/259 |
| 11,094,554 B2 | 8/2021 | Lin et al. | |
| 2007/0270080 A1 | 11/2007 | Barada | |
| 2017/0274496 A1* | 9/2017 | Cook | B24B 37/26 |
| 2019/0299354 A1 | 10/2019 | Ando et al. | |

* cited by examiner

FIG. 2C

CHEMICAL MECHANICAL POLISHING APPARATUS AND METHOD OF CONTROLLING THE SAME

CROSS-REFERENCE TO RELATED APPLICATION

This application claims priority to and the benefit thereof under 35 U.S.C. § 119 to Korean Patent Application No. 10-2022-0187872, filed in the Korean Intellectual Property Office on Dec. 28, 2022, the entire contents of which are incorporated herein by reference.

BACKGROUND

Field

The present disclosure relates to a chemical mechanical polishing (CMP) apparatus, and more particularly, to a chemical mechanical polishing apparatus and a method of controlling the same, which are capable of polishing an edge portion of a front surface or a rear surface of a wafer.

DESCRIPTION OF THE RELATED ART

A chemical mechanical polishing (CMP) apparatus is used for a polishing process of flattening a surface of a semiconductor wafer. In general, a semiconductor element is manufactured by optionally or repeatedly performing a process such as photographing, etching, diffusion, chemical vapor deposition, ion implantation, or metal vapor deposition on a wafer. In this process, the semiconductor wafer is subjected to the chemical mechanical polishing (CMP) process such as flattening etch back to make it easy to form a circuit pattern on a surface.

The CMP process is mainly performed by disposing a wafer so that a rear surface (back side) of the wafer is directed toward a membrane and polishing a front surface (front side) of the wafer on which a film is deposited. The front surface is polished by a frictional force with a pad and a chemical reaction with slurry, whereas the rear surface is disposed to face the membrane without being separately polished. For this reason, there is a problem in that a bevel film remains at an edge of the rear surface.

SUMMARY

The present disclosure has been made in an effort to provide a chemical mechanical polishing apparatus capable of removing a bevel film remaining at an edge of a front surface or a rear surface of a wafer.

The present disclosure has also been made in an effort to provide a chemical mechanical polishing apparatus capable of precisely removing a bevel film remaining on a front surface or a rear surface of a wafer.

The present disclosure has also been made in an effort to provide a method of controlling the chemical mechanical polishing apparatus having the above-mentioned advantages.

An embodiment provides a chemical mechanical polishing apparatus including: a polishing pad having a hollow shape and including a plurality of first grooves disposed at an edge of the polishing pad and arranged in a circumferential direction; a substrate support positioned below the polishing pad and including an edge portion that adjoins the plurality of first grooves, the substrate support being configured to mount a wafer; and a slurry supplier positioned above the wafer and configured to supply slurry to the wafer. In aspects of the embodiment, the substrate support may include: a membrane positioned below the wafer and configured to come into contact with the wafer; a slip prevention ring configured to support the wafer being in contact with the membrane; a support plate on which the membrane is positioned; and a rotating shaft configured to rotate the substrate support.

In aspects of the embodiment, the polishing pad may include at least one second groove having a larger width than each of the plurality of first grooves. In aspects of the embodiment, at least some of the plurality of first grooves may be arranged at different intervals in the circumferential direction. In aspects of the embodiment, in the first groove, a ratio of a length in a circumferential direction to a length in a direction perpendicular to the circumferential direction may be 0.1 to 1.0.

In aspects of the embodiment, the support plate may include at least one washing groove provided at an edge thereof. In aspects of the embodiment, the support plate may include a plurality of washing grooves, and the plurality of washing grooves may be disposed at different intervals in a direction in which the substrate support rotates.

In aspects of the embodiment, the polishing pad may include a fixing support. In the embodiment, the chemical mechanical polishing apparatus may further include a polishing flattener disposed on the polishing pad and configured to fix the polishing pad.

In aspects of the embodiment, the polishing flattener may include a fixing support. In the embodiment, the slurry supplier may supply the slurry to the wafer, and the slurry may be supplied to the edge portion of the wafer by a centrifugal force generated by a rotation of the substrate support. In aspects of the embodiment, a position at which the slurry supplier supplies the slurry to the wafer may be within a region corresponding to 30% or more of a radius of the wafer in a direction from a center portion to an edge of the wafer.

Another embodiment of the present disclosure provides a chemical mechanical polishing apparatus including: a polishing flattener; a polishing pad disposed below the polishing flattener and having a hollow shape, the polishing pad including a plurality of first grooves disposed at an edge of the polishing pad and arranged in a circumferential direction; a substrate support positioned below the polishing pad and including an edge portion that adjoins the plurality of first grooves, the substrate support being configured to mount a wafer; a slurry supplier positioned above the wafer and configured to supply slurry to the wafer; and a fixing support configured to fix the polishing flattener, in which the substrate support includes: a membrane positioned below the wafer and configured to come into contact with the wafer; a slip prevention ring configured to support the wafer; a support plate on which the membrane is positioned; and a rotating shaft configured to rotate the substrate support.

In aspects of the embodiment, the membrane may be disposed at an edge portion among a center portion, a middle portion, and the edge portion of the wafer. In aspects of the embodiment, the membrane may include at least one partition wall provided in the form of a concentric circle. In aspects of the embodiment, the slurry supplier may be disposed above a hollow portion of the polishing pad.

Still another embodiment of the present disclosure provides a method of controlling a chemical mechanical polishing apparatus, the method including: preparing a substrate support on which no wafer is mounted and preparing a polishing pad having a hollow shape and including a plurality of first grooves disposed at an edge of the polishing pad and arranged in a circumferential direction; loading a wafer onto a loading shaft configured to be movable vertically in the substrate support; bringing the loaded wafer into contact with a membrane disposed in the substrate support; supplying slurry onto the wafer from the slurry supplier; and polishing an edge of the wafer while rotating the substrate support.

In aspects of the embodiment, the method may further include washing the polishing pad and the substrate support after the polishing of the edge of the wafer while rotating the substrate support, and the washing of the polishing pad and the substrate support may include separating the completely polished wafer, conditioning the polishing pad with a disc, and removing impurities in the substrate support. In aspects of the embodiment, the loading of the wafer may be performed by a robot configured to transfer the wafer. In aspects of the embodiment, the polishing of the edge of the wafer while rotating the substrate support may include simultaneously rotating the polishing pad and the substrate support.

The chemical mechanical polishing apparatus according to aspects of the embodiments of the present disclosure includes the polishing pad having the plurality of grooves, thereby removing the bevel film remaining at the edge of the front surface or the rear surface of the wafer.

The chemical mechanical polishing apparatus according to aspects of the embodiments of the present disclosure includes the polishing pad having the plurality of grooves and precisely removes the bevel film remaining at the edge of the front surface or the rear surface of the wafer by patterning the membrane in the substrate support.

The method of controlling the chemical mechanical polishing apparatus according to aspects of the embodiments of the present disclosure provides the method of controlling the chemical mechanical polishing apparatus that has the above-mentioned advantages.

BRIEF DESCRIPTION OF THE DRAWINGS

FIG. 2C is a view illustrating characteristics of a first groove according to example embodiments.

DETAILED DESCRIPTION

Figure 1A:
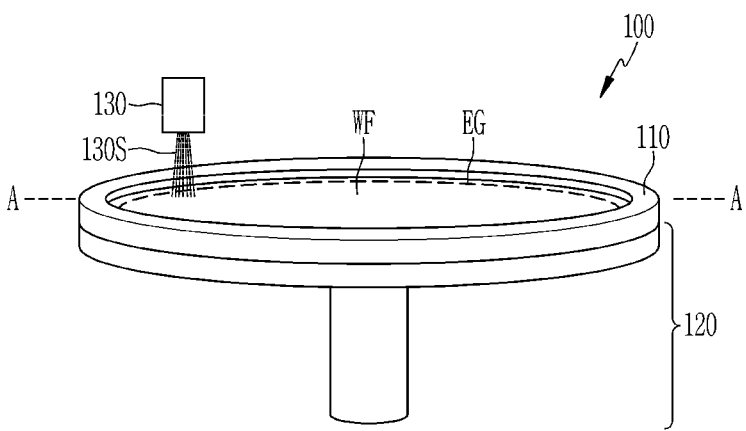
FIG. 1A is a perspective view of a chemical mechanical polishing apparatus according to example embodiments.

Hereinafter, several embodiments of the present disclosure will be described in detail with reference to the accompanying drawings so that those with ordinary skill in the art to which the present disclosure pertains may easily carry out the embodiments. The present disclosure may be implemented in various different ways and is not limited to the embodiments described herein.

A part irrelevant to the description will be omitted to clearly describe the present disclosure, and the same or similar constituent elements will be designated by the same reference numerals throughout the specification.

In addition, a size and thickness of each constituent element illustrated in the drawings are arbitrarily shown for convenience of description, but the present disclosure is not limited thereto. In order to clearly describe several layers and regions, thicknesses thereof are enlarged in the drawings. In the drawings, the thicknesses of some layers and regions are exaggerated for convenience of description.

In addition, when one component such as a layer, a film, a region, or a plate is described as being positioned "above" or "on" another component, one component can be positioned "directly on" another component, and one component can also be positioned on another component with other components interposed therebetween. On the contrary, when one component is described as being positioned "directly on" another component, there is no component therebetween. When an element is referred to as "contacting" or "in contact with" another element, there are no intervening elements present at the point of contact.

In addition, when a component is described as being positioned "above" or "on" a reference part, the component may be positioned "above" or "below" the reference part, and this configuration does not necessarily mean that the component is positioned "above" or "on" the reference part in a direction opposite to gravity.

Throughout the specification, unless explicitly described to the contrary, the word "comprise/include" and variations such as "comprises/includes" or "comprising/including" will be understood to imply the inclusion of stated elements, not the exclusion of any other elements.

Throughout the specification, the word "in a plan view" means when an object is viewed from above, and the word "in a cross-sectional view" means when a cross section made by vertically cutting an object is viewed from a lateral side.

Hereinafter, an embodiment of the present disclosure will be described in detail so that those skilled in the technical field to which the present disclosure pertains may easily carry out the embodiment. However, the present disclosure may be implemented in various different ways and is not limited to the embodiments described herein.

Figure 1B:
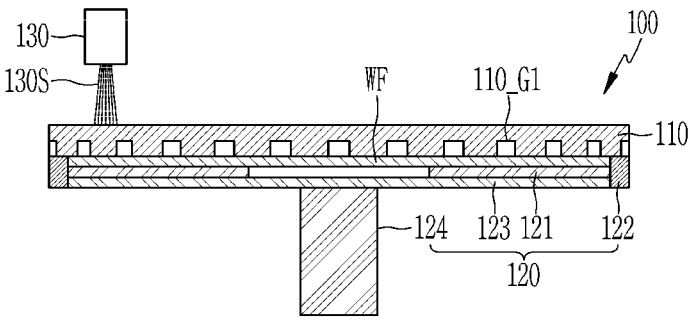
FIGS. 1B and 1C are cross-sectional views of the chemical mechanical polishing apparatus in FIG. 1A when taken along line A-A'.
Figure 1C:
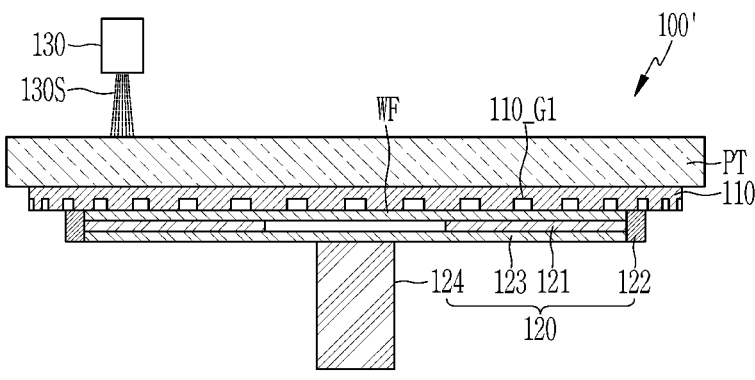

FIG. 1A is a perspective view of a chemical mechanical polishing apparatus 100 according to an example embodiment, and FIGS. 1B and 1C are cross-sectional views of the chemical mechanical polishing apparatus 100 in FIG. 1A when taken along line A-A'.

Referring to FIGS. 1A and 1B, the chemical mechanical polishing apparatus 100 is an apparatus for polishing a wafer WF and includes a polishing pad 110, a head part 120, and a slurry supplier 130. Herein, the head part 120 is also referred to as a substrate support. The chemical mechanical polishing apparatus 100 mechanically polishes the wafer WF mounted on a bottom surface of the head part 120 by bringing the wafer WF into contact with the polishing pad 110 and chemically polishes the wafer WF by means of a chemical reaction with slurry 130S supplied from the slurry supplier 130.

The polishing pad 110 may be a member that performs the mechanical polishing to uniformly flatten a surface of the wafer WF. In the embodiment, the polishing pad 110 may have a hollow shape. Specifically, the polishing pad 110 may have a shape having an empty central region.

In example embodiments, the polishing pad 110 may have a ring shape. Specifically, the ring shape has a structure having an empty central region and an edge with a predetermined width, which makes it possible to minimize interference caused by an arrangement of the slurry supplier 130 configured to supply slurry.

In example embodiments, the polishing pad 110 may include a plurality of first grooves 110_G1 arranged at the edge in a circumferential direction. The edge means a peripheral portion of the polishing pad 110. Specifically, the edge may mean a region corresponding to an edge portion EG of the wafer WF to polish the edge portion EG of the wafer WF to be described below. In example embodiments, the polishing pad 110 may include the plurality of first grooves 110_G1 disposed at the edge and arranged at predetermined intervals in the circumferential direction.

The polishing pad 110 includes the plurality of first grooves 110_G1, thereby polishing an edge portion EG of a front surface or a rear surface of the wafer WF as a target. Specifically, when polishing the front surface of the wafer WF, it is possible to polish the edge portion EG of the front surface of the wafer WF on which deposits are deposited by setting the edge portion EG of the front surface of the wafer WF as a target. Further, when polishing the rear surface of the wafer WF, it is possible to polish a bevel layer on which the deposits are partially accumulated at the edge portion EG of the rear surface of the wafer WF during a process of depositing the deposits onto the front surface of the wafer WF.

The head part 120 may be a member positioned below the polishing pad 110 and configured to be rotatable in a state in which the wafer WF is mounted on the head part 120. In the embodiment, the head part 120 may mount the wafer WF including an edge portion EG that adjoins the plurality of first grooves 110_G1.

A region of the wafer WF from a center to an edge thereof may be divided into a center portion, a middle portion, and the edge portion EG. Specifically, a polishing portion of the polishing pad 110, which adjoins the plurality of first grooves 110_G1, may be adjacent to the edge portion EG of the wafer WF. More specifically, the wafer WF mounted on the head part 120 rotates while being in contact with the plurality of first grooves 110_G1 disposed at the edge of the polishing pad 110 and arranged in the circumferential direction, such that the polishing portion, which is the edge portion EG of the wafer WF, may be mechanically polished.

In the embodiment, the head part 120 may include a membrane 121 positioned below the wafer WF and configured to come into contact with the wafer WF, a slip prevention ring 122 configured to support the wafer WF, a support plate 123 on which the membrane is positioned, and a rotating shaft 124 configured to rotate the head part 120. Specifically, the head part 120 may include the membrane 121 positioned below the wafer WF and configured to come into contact with the wafer WF, the slip prevention ring 122 configured to support the wafer WF being in contact with the membrane 121, the support plate 123 on which the membrane 121 is positioned, and the rotating shaft124 configured to rotate the head part 120.

The wafer WF may be attached to the membrane 121, and the membrane 121 may serve to control an external force applied in accordance with a zone of the wafer WF. For example, the membrane 121 may be made of a flexible material. The membrane 121 may be a member that assists a plurality of independently controllable pressurization chambers in applying independently controllable pressure to relevant zones on the wafer WF.

The slip prevention ring 122 may be a member that prevents a slip of the wafer WF. Specifically, the slip prevention ring 122 may have a ring shape that surrounds the wafer WF. The slip prevention ring 122 may surround side surfaces of the membrane 121, the support plate 123, and the wafer WF. In example embodiments, the slip prevention ring 122 may contact side surfaces of the membrane 121, the support plate 123, and the wafer WF. The slip prevention ring 122 may be disposed outside the wafer WF and prevent the separation of the wafer WF that may occur during the polishing process. For example, the slip prevention ring 122 may be prevent the wafer WF from slippage or movement that may occur during the polishing process.

The support plate 123 may be a member for supporting the wafer WF and the membrane 121. Specifically, the support plate 123 may be disposed on a lower surface of the membrane 121 and fix and support the wafer WF and the membrane 121.

The rotating shaft 124 may be a member configured to control the head part 120 so that the head part 120 is rotatable. In the embodiment, the head part 120 may be rotated by a first controller (not illustrated). The rotating shaft 124 may be connected to a lower portion of the head part 120. The rotating shaft 124 may be configured to rotate by a driving device such as a motor, thereby causing the head part 120 to rotate in a predetermined direction. For example, the first controller may perform control to rotate the wafer WF mounted on the head part 120 by rotating the head part 120, specifically, a central shaft of the head part 120.

The first controller may control an overall operation of the chemical mechanical polishing apparatus 100. For example, the first controller may control a rotational speed of the head part 120, a flow rate per unit time of the slurry 130S supplied from the slurry supplier 130, and the like. The first controller, for example, may be implemented with at least one processor such as a central processing unit (CPU), a graphics processing unit (GPU), a microprocessor, an application specific integrated circuit (ASIC), a field programmable gate arrays (FPGA), and the like, and may be provided with a memory (e.g., random access memory (RAM), read only memory (ROM), storage media, etc.) for storing various data necessary for the operation of the chemical mechanical polishing apparatus 100 (e.g., data, information, computer program instructions, etc.). For example, the at least one processor may be configured to execute computer program instructions stored in the memory and to thereby perform various processes and methods disclosed herein. For example, the first controller may be configured to perform the processes and methods described herein, with such processes and methods implemented in hardware, software, firmware, or any combination thereof. If implemented in software, the functions can be stored as one or more instructions or code on computer-readable medium, including the memory described above. The first controller may control the power supplied from a power supply device (not shown). Thereby, the first controller may control a polishing rate of the CMP process.

The slurry supplier 130 may be a member that supplies slurry to the wafer WF. The slurry supplier 130 may be a member positioned above the wafer WF and configured to supply slurry to the surface of the wafer WF. Specifically, the slurry supplier 130 may be a member that supplies the slurry to the surface of the wafer WF, e.g., a portion spaced apart from the center portion at a predetermined distance, thereby performing the chemical polishing to uniformly flatten the edge portion EG of the surface of the wafer WF. The slurry supplier 130 may include at least one nozzle (not illustrated), and may spray a slurry onto a surface of the polishing pad 110 through the nozzle.

In the embodiment, the slurry supplier 130 may be disposed above the hollow portion of the polishing pad 110. Because the slurry supplier 130 is disposed above the hollow portion of the polishing pad 110, the slurry may be supplied into the hollow portion in a state in which interference between the slurry supplier 130 and the polishing pad 110 is minimized.

Referring to FIG. 1C, in example embodiments, a chemical mechanical polishing apparatus 100' may further include a polishing flattener PT. The polishing flattener PT may be a member for mounting the polishing pad 110. In the embodiment, the polishing flattener PT may be a member disposed on the polishing pad 110 and configured to fix the polishing pad 110.

In the embodiment, the polishing flattener PT may apply rotational energy so that the polishing pad 110 rotates in a predetermined direction. In example embodiments, the polishing flattener PT may apply rotational energy so that the polishing pad 110 rotates in the same direction as the head part 120. In the embodiment, the polishing flattener PT may allow the polishing pad 110 to be rotatable by a second controller (not illustrated). Because the polishing pad 110 also rotates together with the head part 120, a more precise polishing process may be performed.

In the embodiment, like the polishing pad 110, the polishing flattener PT may have a hollow shape. For example, the polishing flattener PT may have a hollow ring shape. Because the polishing flattener PT has a similar structure to the polishing pad 110, it is possible to minimize interference when the slurry supplier 130 supplies the slurry to the wafer WF.

Figure 2A:
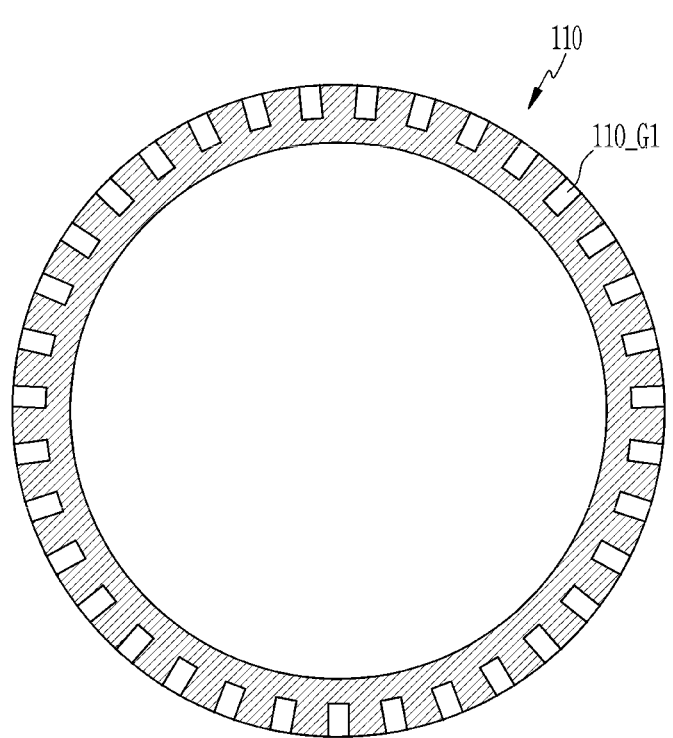
FIG. 2A is a view illustrating a shape of a polishing pad according to example embodiments.
Figure 2B:
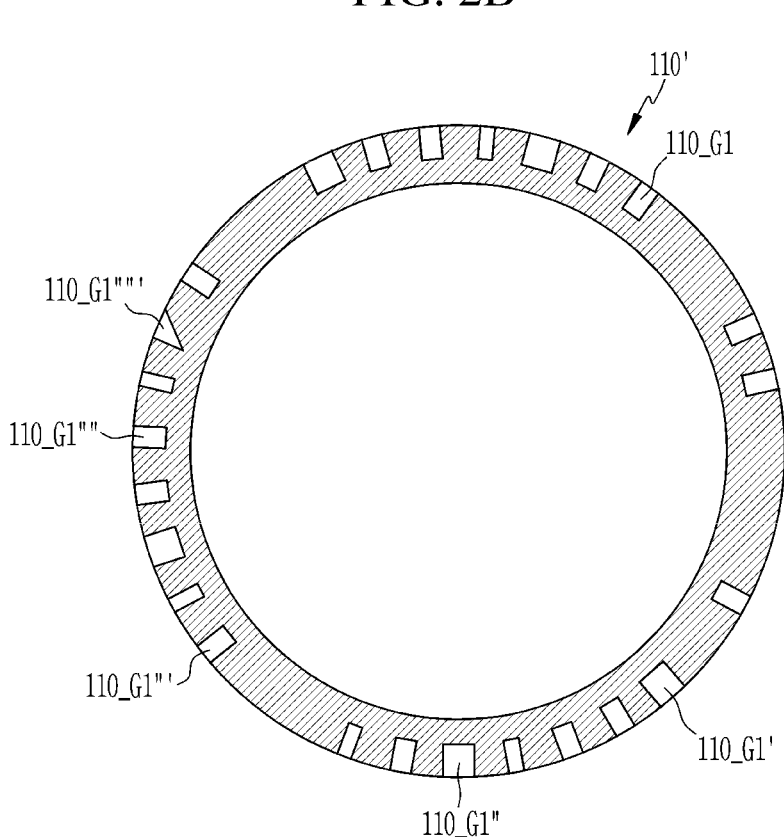
FIG. 2B is a view illustrating interval characteristics of the polishing pad according to example embodiments.
Figure 2C:
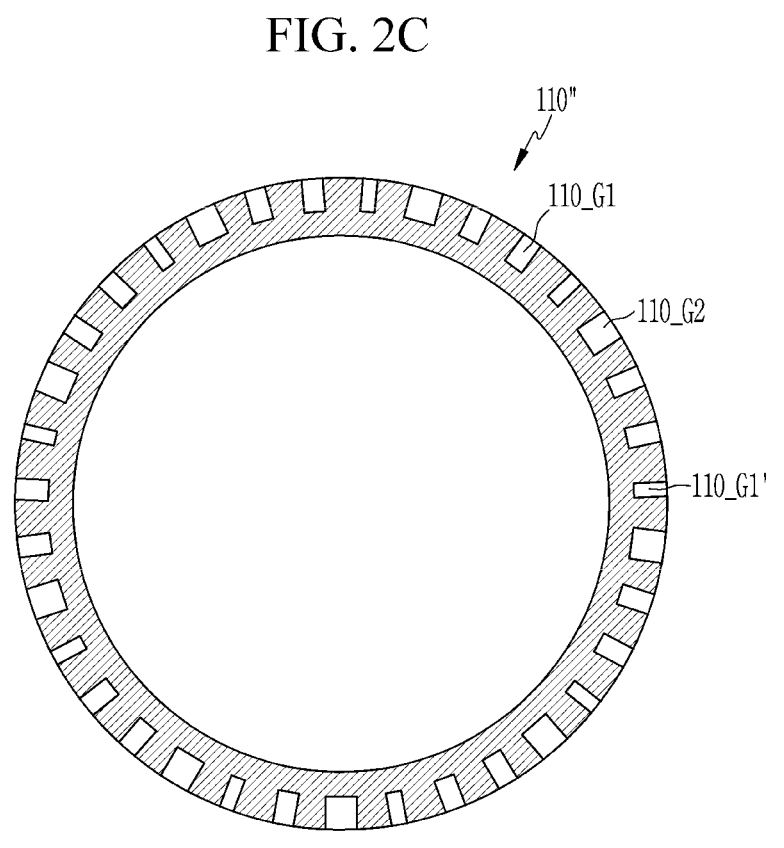
Figure 2D:
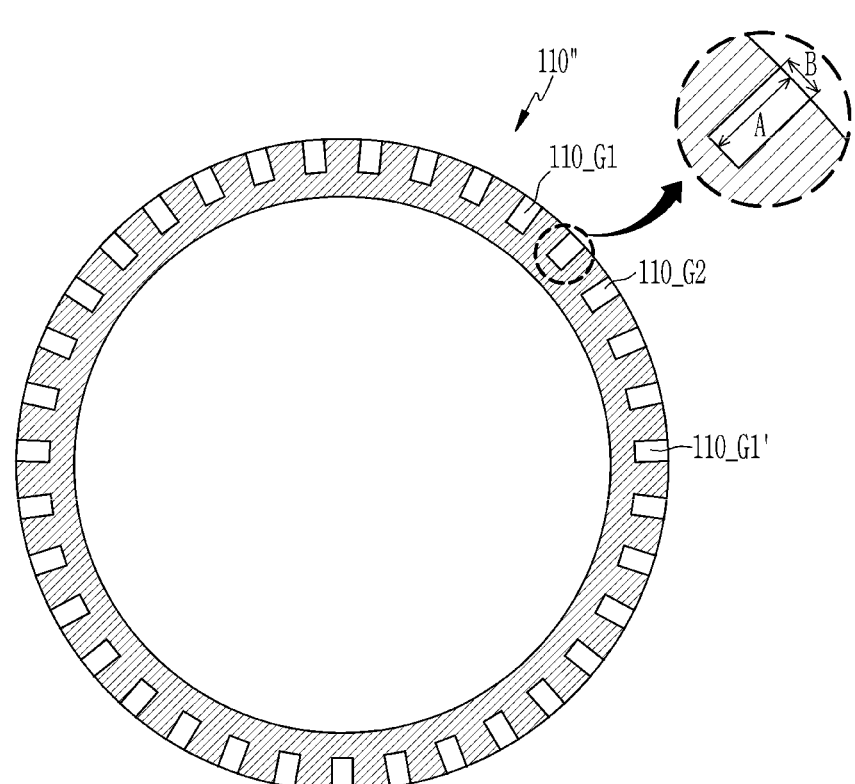
FIG. 2D is a view illustrating the polishing pad including a second groove of the polishing pad.

FIGS. 2A and 2B respectively illustrate the polishing pads 110 and 110' according to example embodiments, FIG. 2C illustrates characteristics of a first groove 110_G1 of a polishing pad 110" according to example embodiments, and FIG. 2D illustrates a polishing pad 110'" including second grooves 110_G2 for preventing slurry stagnation according to example embodiments.

FIGS. 2A to 2D illustrate the polishing pads 110, 110', 110", and 110'", respectively, when viewed from below. Referring to FIG. 2A, the plurality of first grooves 110_G1 of the polishing pad 110 may be disposed at equal intervals. FIG. 2A illustrates that the plurality of first grooves 110_G1 each has a quadrangular shape, but the present disclosure is not limited thereto. The first groove may have a triangular shape, a trapezoidal shape, a polygonal shape, or a shape in which a part of an edge thereof has a curved shape.

Referring to FIG. 2B, in the embodiment, the plurality of first grooves 110_G1 of the polishing pad 110 may be disposed at different intervals. Because the plurality of first grooves 110_G1 is disposed at different intervals, a polishing speed may be easily controlled. For example, at least some of the plurality of first grooves 110_G1 may be disposed at different intervals in the circumferential direction.

In the embodiment, the polishing pad 110 may further include dummy grooves 110_G1', 110_G1", 110_G1", 110_G1", and 110_G1" having different shapes and/or sizes from the plurality of first grooves 110_G1. For example, certain of the dummy grooves 110_G1', 110_G1", 110_G1", and 110_G1", and 110_G1" may have larger or smaller widths than the plurality of first grooves 110_G1. As another example, dummy grooves 110_G1" may have a triangular shape. In example embodiments, the plurality of first grooves 110_G1 and the dummy grooves 110_G1', 110_G1", 110_G1", 110_G1", and 110_G1" may be disposed at different intervals. As illustrated in FIG. 2B, the polishing speed may be easily controlled as shapes and/or sizes of the grooves are variously adjusted or the grooves are disposed at different intervals.

Referring to FIG. 2C, in the embodiment, the polishing pad 110 may include at least one second groove 110_G2 having a larger width than each of the plurality of first grooves 110_G1. Because the second groove 110_G2 has a larger width than the first groove 110_G1, it is possible to prevent the slurry from stagnating and hindering the polishing process during the polishing process.

Referring to FIG. 2D, in the first groove 110_G1 in the embodiment, a ratio of a length B in a circumferential direction to a length A in a direction perpendicular to the circumferential direction may be 0.1 to 1.0. When the ratio of the first groove 110_G1 satisfies the above-mentioned range, the edge portion EG of the wafer WF may be appropriately polished within a target range. In a case that the ratio of the first groove 110_G1 deviates from the above-mentioned range, the surface of the wafer WF may be excessively polished or cannot be appropriately polished.

Figure 3A:
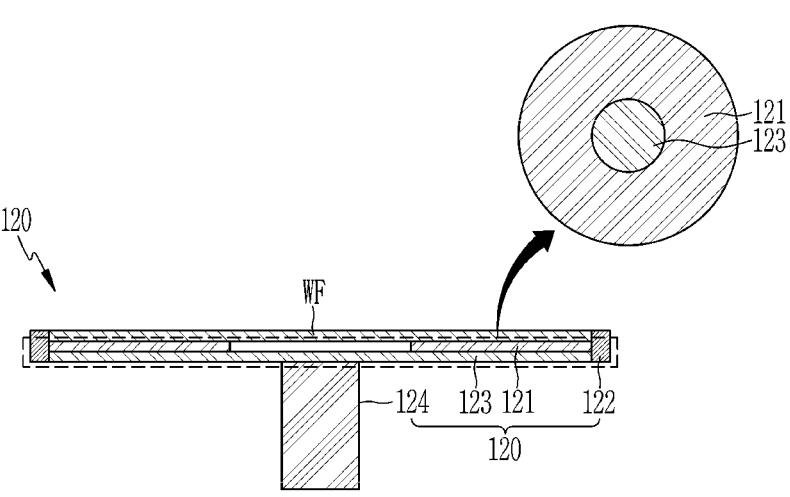
FIGS. 3A to 3C are a cross-sectional view and a top plan view of a head part according to example embodiments.
Figure 3B:
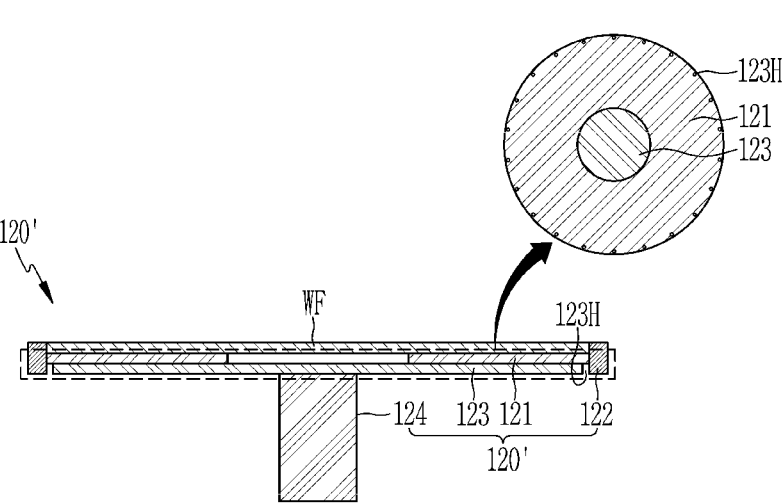
Figure 3C:
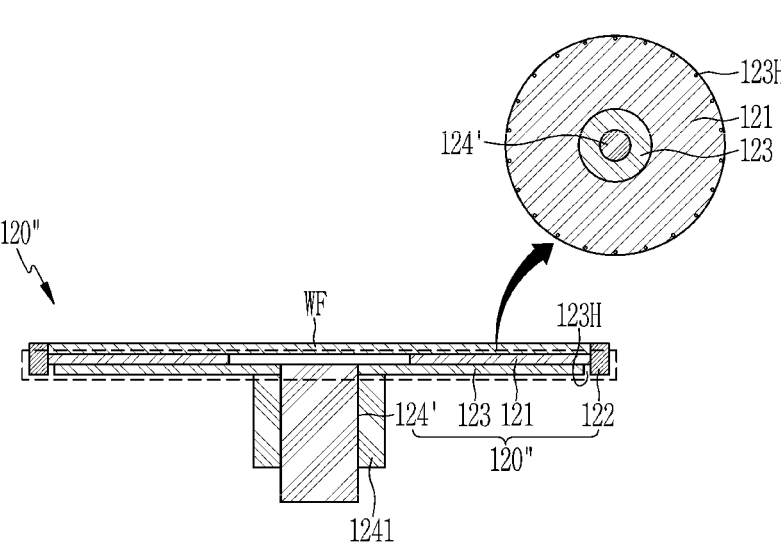

FIGS. 3A to 3C are a front view and a top plan view of the head part 120 according to example embodiments.

FIGS. 3A to 3C are front views of the head part 120 and top plan views of the head part 120 when the wafer WF is removed. Referring to FIG. 3A, the membrane 121 may be disposed in the edge region of the support plate 123 so as to come into contact with the edge portion EG of the wafer WF.

Referring to FIG. 3B, in the embodiment, the support plate 123 of the head part 120' may include at least one washing groove 123H formed at an edge thereof. The washing grooves 123H may be grooves that allow for easy removal of impurities such as slurry by-products. After the wafer WF is removed after the polishing process or operation, the washing grooves 123H may easily discharge the impurities during a separate process such as a cleaning process.

As illustrated in FIG. 3C, in the embodiment, the rotating shaft 124 of the head part 120" may include a loading shaft 124' and a support ring 1241. The loading shaft 124' may move vertically to load the wafer WF. The support ring 1241 may surround the loading shaft 124'. The support ring 1241 may support the loading shaft 124'. The loading shaft 124' may not only serve to load the wafer WF but also rotate by being connected to the first controller.

Figure 4A:
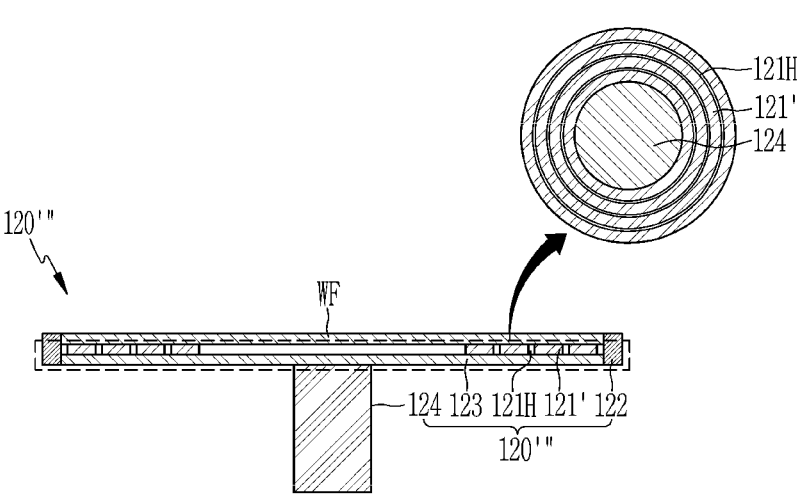
FIGS. 4A and 4B are a cross-sectional view and a top plan view of an arrangement state of a membrane according to example embodiments.
Figure 4B:
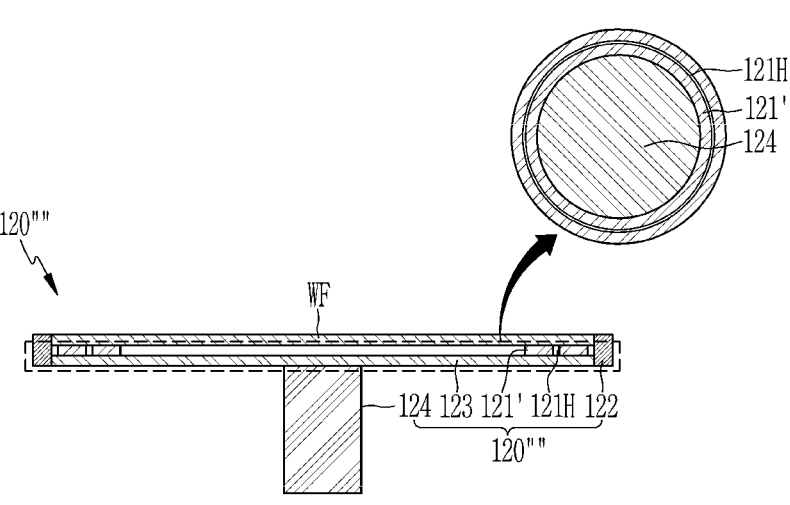

FIGS. 4A and 4B illustrate arrangement states of the membrane 121 according to example embodiments.

FIGS. 4A and 4B are a front view and a top plan view illustrating patterns of the membrane 121' of head part 120". Referring to FIGS. 4A and 4B, the membrane 121' according to example embodiments may include at least one partition wall 121H provided in the form of a concentric circle.

The membrane 121' may be disposed while adjoining the center portion, the middle portion, and the edge portion EG of the wafer WF. In the embodiment, the membrane 121' disposed at the edge portion EG may be divided into the plurality of membranes 121' by the at least one partition wall 121H. The partition wall 121H may be a member that assists in independently operating the plurality of membranes 121'. The partition wall 121H may be a partition wall made of a silicon-based material. FIG. 4A illustrates four membranes 121' and three partition walls 121H, and FIG. 4B illustrates two membranes 121' and one partition wall 121H. However, the present disclosure is not limited thereto.

Pressures of the membranes 121' may be independently controlled by a pressure adjustment part (not illustrated). The plurality of independent membranes 121', which is disposed with the partition wall 121H interposed therebetween, may be controlled to have the same pressure or different pressures. The plurality of membranes 121' is patterned by the at least one partition wall 121H, such that the edge portion EG of the wafer WF may be polished more precisely.

Figure 5A:
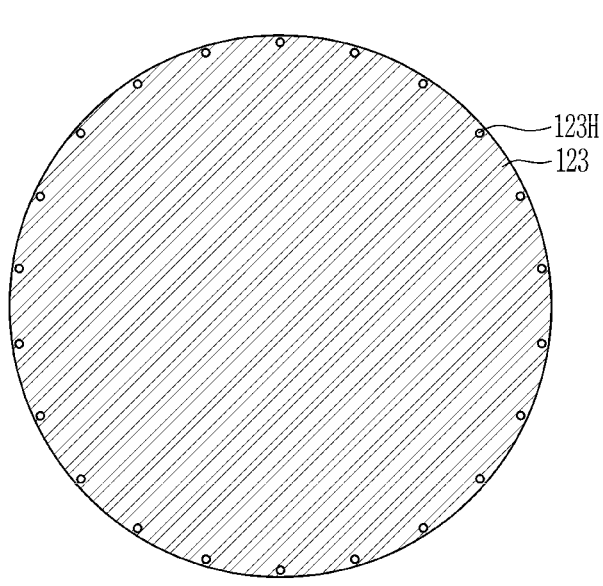
FIGS. 5A and 5B are top plan views illustrating a pattern of a washing groove according to example embodiments.
Figure 5B:
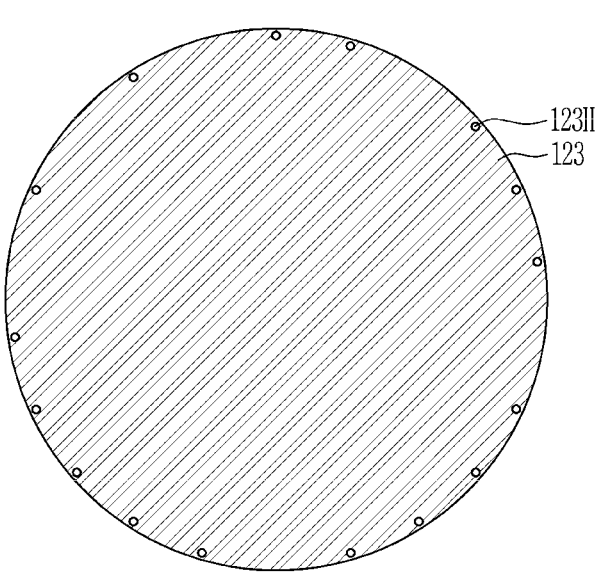

FIGS. 5A and 5B are top plan views illustrating patterns of the washing grooves 123H according to the embodiment.

Referring to FIGS. 5A and 5B, at least one washing groove 123H is disposed in the edge region of the support plate 123. In a case that the washing groove 123H is provided as a plurality of washing grooves 123H, the plurality of washing grooves 123H may be disposed at equal intervals, as illustrated in FIG. 5A. In the alternative, the plurality of washing grooves 123H may be disposed at different intervals, as illustrated in FIG. 5B. The patterns of the washing grooves 123H are variously formed, such that a speed of processing impurities may be controlled depending on a degree of polishing during the process. For example, based on a number and/or interval of the washing groves 123H, the amount of processing impurities removed from the surface of the wafer WF via the washing groves 123H may be controlled. In example embodiments, the plurality of washing grooves 123H may be disposed at different intervals in a direction in which the head part 120 rotates.

Figure 6A:
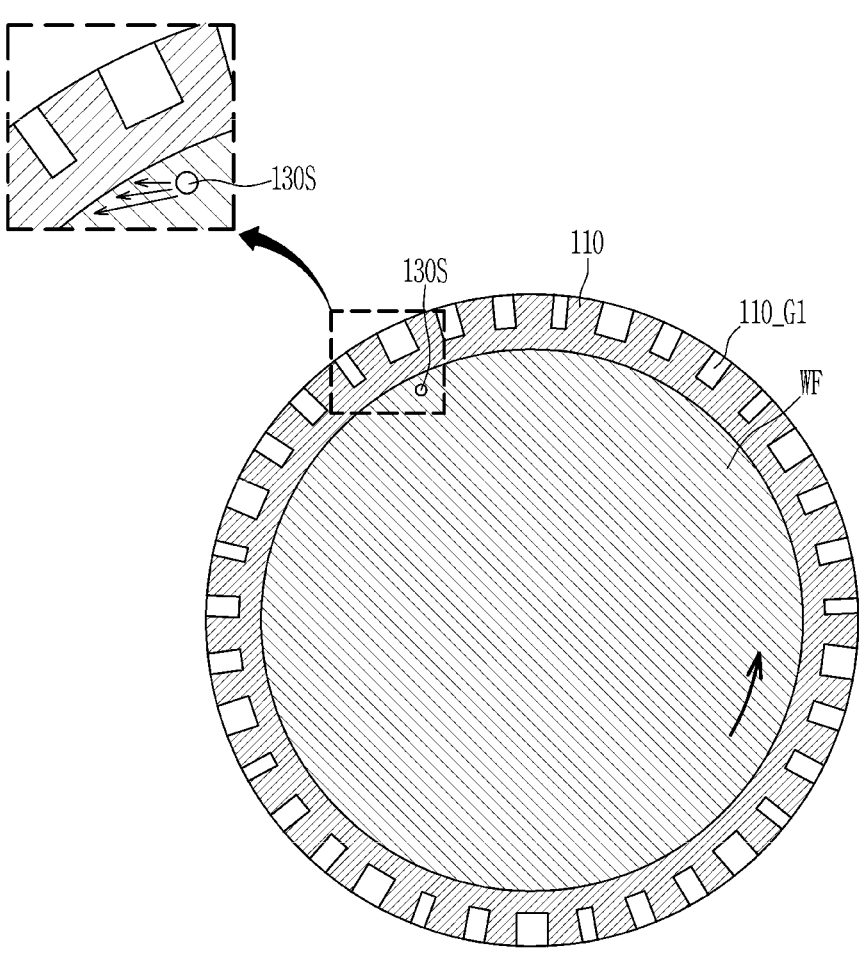
FIG. 6A is a view illustrating a polishing principle implemented by a slurry supplier according to example embodiments.
Figure 6B:
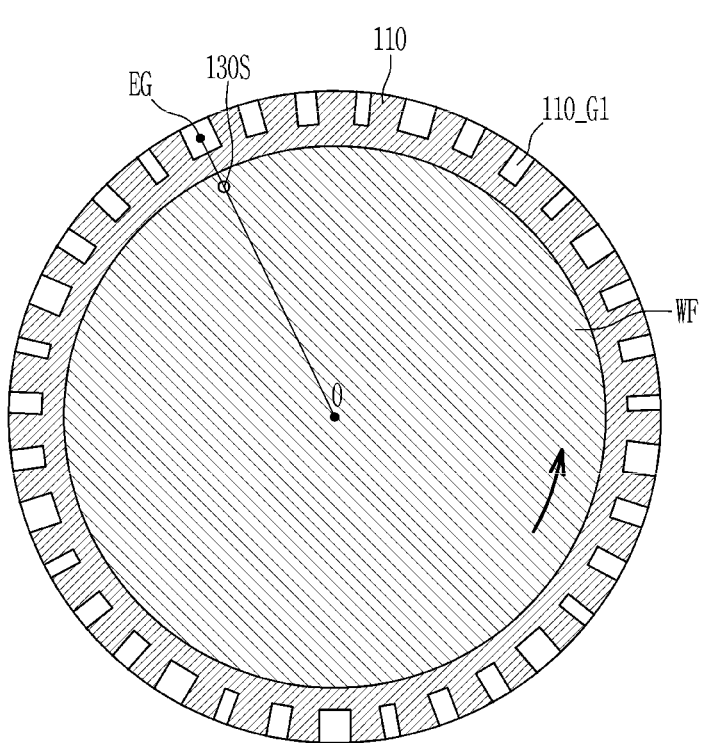
FIG. 6B is a view illustrating a dropping position of slurry according to example embodiments.

FIG. 6A is a view illustrating a polishing principle implemented by the slurry supplier 130 according to example embodiments, and FIG. 6B is a view illustrating a dropping position of slurry according to example embodiments.

Referring to FIG. 6A, slurry 130S supplied from the slurry supplier 130 may be supplied to the edge portion EG of the wafer WF by a centrifugal force generated by the rotation of the head part 120. In the embodiment, the slurry supplier 130 may be disposed so that the slurry 130S falls into the hollow portions of the polishing pad 110 and the polishing flattener PT in order to supply the slurry 130S without affecting the polishing pad 110 and the polishing flattener PT.

The slurry 130S dropped into the hollow portion moves to the edge portion EG of the wafer WF, which is the polishing portion, as the head part 120 rotates. Thereafter, the slurry 130S may serve to perform the chemical polishing by means of the chemical reaction at the edge portion EG.

Referring to FIG. 6B, in the embodiment, a position at which the slurry supplier 130 supplies the slurry 130S to the wafer WF may be in a region corresponding to 30% or more of a radius of the wafer WF in a direction from the center portion O to the edge portion EG of the wafer WF. Specifically, the position may be in a region corresponding to 70% or more. In a case that the slurry 130S is supplied within the above-mentioned range, an effect of moving the slurry 130S by the centrifugal force of the head part 120 may be used. In the case that the above-mentioned range is not satisfied, the effect of moving the slurry 130S is insufficient, which makes it difficult to smoothly perform the polishing process.

Figure 7A:
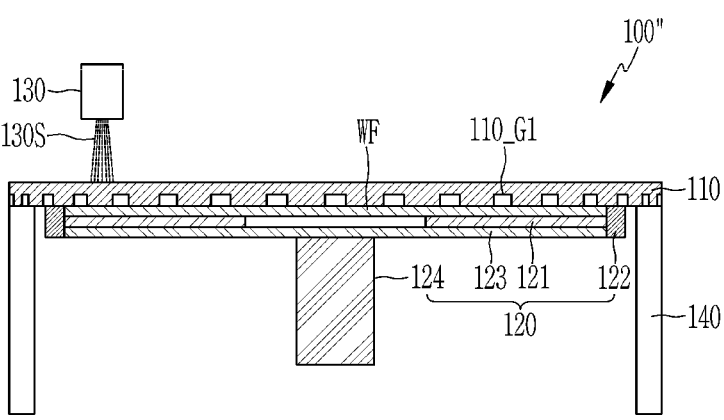
FIGS. 7A and 7B are views illustrating the chemical mechanical polishing apparatus according to example embodiments.
Figure 7B:
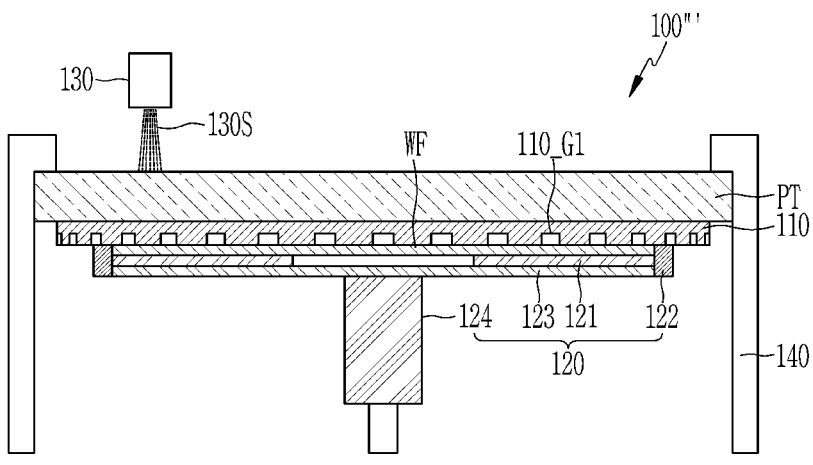

FIGS. 7A and 7B respectively illustrate the chemical mechanical polishing apparatuses 100" and 100" according to example embodiments of the present disclosure.

Referring to FIG. 7A, the polishing pad 110 of the chemical mechanical polishing apparatus 100" may further include a fixing support 140. The fixing support 140 may be provided below the polishing pad 110. The fixing support 140 may contact a lower surface of the polishing pad 110. In example embodiments, the fixing support 140 may be coupled to a lower surface of the polishing pad 110. The polishing pad 110 is fixed by the fixing support 140, such that the polishing process may be precisely performed. For example, the fixing support 140 may be a member such as a cylinder and may fix the polishing pad 110. For example, the fixing support 140 may hold the polishing pad 110 in a fixed position so as to ensure the balance and stability of the polishing pad 110. In the embodiment, the fixing support 140 may be provided as a plurality of fixing supports 140. In example embodiments, three or more fixing supports 140 may be disposed to ensure balance and stability.

Because the polishing pad 110 is fixed by the fixing support 140, the polishing pad 110 does not separately rotate, and only the head part 120 rotates, such that the edge portion EG of the wafer WF may be polished. Because the polishing process is performed only by rotating the head part 120, a separate member for additionally rotating the polishing pad 110 is not required, which provides an advantage of economic feasibility.

Referring to FIG. 7B, in example embodiments, the chemical mechanical polishing apparatus 100" may include the polishing flattener PT disposed on the polishing pad 110 and configured to fix the polishing pad 110. The polishing flattener PT may further include a fixing support 140'. A detailed description of the fixing support 140' is identical to the above-mentioned description with reference to FIG. 7A within the non-contradictory range. For example, the fixing support 140' may be spaced apart from the polishing pad 110. The fixing support 140' may contact a side surface and an upper surface of the polishing flattener PT. The fixing support 140' may be coupled to the side surface and/or the upper surface of the polishing flattener PT. For example, the fixing support 140' may hold the polishing flattener PT in a fixed position.

Because the polishing flattener PT is fixed by the fixing support 140', the polishing pad 110 may also rotate together with the head part 120, thereby polishing the edge portion EG of the wafer WF. Because the polishing process is performed by simultaneously rotating the polishing pad 110 and the head part 120, the more precise polishing process may be performed by controlling speeds of the polishing pad 110 and the head part 120.

FIGS. 8A to 8F are views illustrating a method of controlling the chemical mechanical polishing apparatus according to example embodiments. FIG. 9 is a flowchart illustrating the method of controlling the chemical mechanical polishing apparatus, as shown in FIGS. 8A-8F.

Figure 8A:
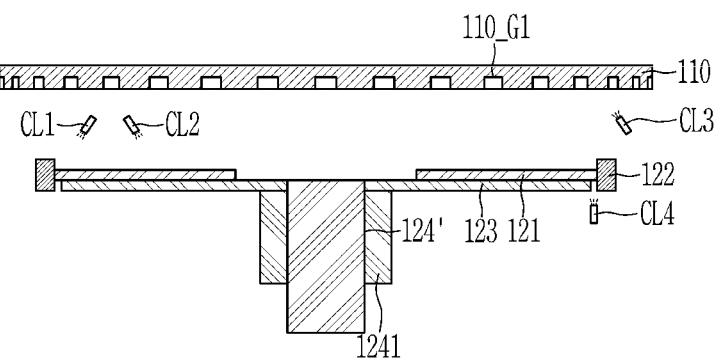
FIGS. 8A to 8F are views illustrating a method of controlling the chemical mechanical polishing apparatus according to example embodiments.
Figure 9:
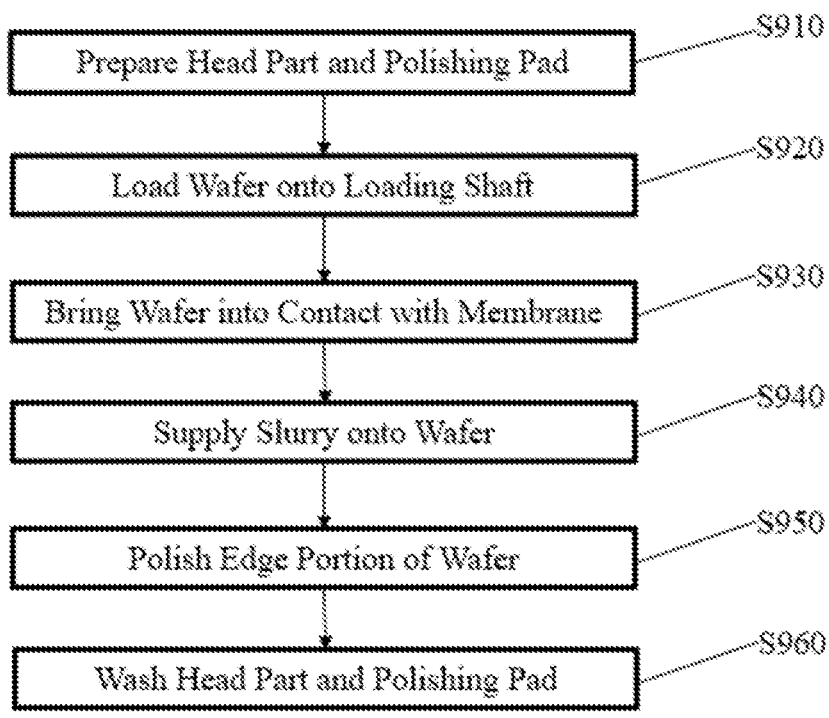
FIG. 9 is a flowchart illustrating the method FIGS. 8A-8F of controlling the chemical mechanical polishing apparatus.

Referring to FIGS. 8A and 9, the method of controlling the chemical mechanical polishing apparatus includes a step of preparing the head part 120 on which no wafer is mounted and preparing the polishing pad 110 having a hollow shape and including the plurality of first grooves 110_G1 arranged in the circumferential direction at the edge thereof (S910). In the step of preparing the head part 120 and the polishing pad 110, the head part 120 and the polishing pad 110 may be disposed to be spaced apart from each other to provide a space into which the wafer is loaded.

In the embodiment, the step of preparing the head part 120 and the polishing pad 110 further includes a step of washing the polishing pad 110 and the head part 120. Specifically, the step of washing the polishing pad 110 and the head part 120 may be performed by using cleaning heads CL1, CL2, CL3, and CL4. Because the washing step is performed as described above, it is possible to prevent introduction of impurities during the polishing process. The washing step may be performed by a method of DIW or air injection, for example.

Figure 8B:
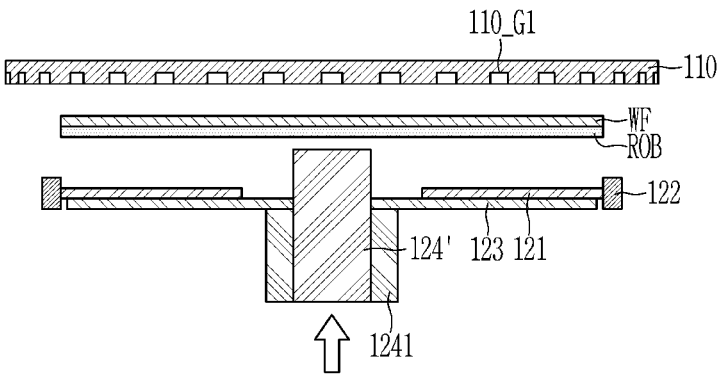

Referring to FIGS. 8B and 9, the method of controlling the chemical mechanical polishing apparatus may include after the step of preparing the head part 120 and the polishing pad 110, a step of loading the wafer WF onto the loading shaft 124' that may move vertically in the head part 120 (S920). The loading shaft 124' may move vertically upward and then load the wafer WF.

In the embodiment, the step of loading the wafer WF may be performed by a robot ROB configured to transfer the wafer WF. In the embodiment, the robot ROB may include a transfer part (not illustrated) to transfer the wafer WF. The transfer part may include a plurality of legs.

In the embodiment, an interval between the plurality of legs may be an interval larger than a major axis length of a horizontal cross-section of the loading shaft 124'. Because the interval between the legs is larger than the major axis length of the horizontal cross-section of the loading shaft 124', the wafer WF may be loaded by the robot ROB without separate interference.

Figure 8C:
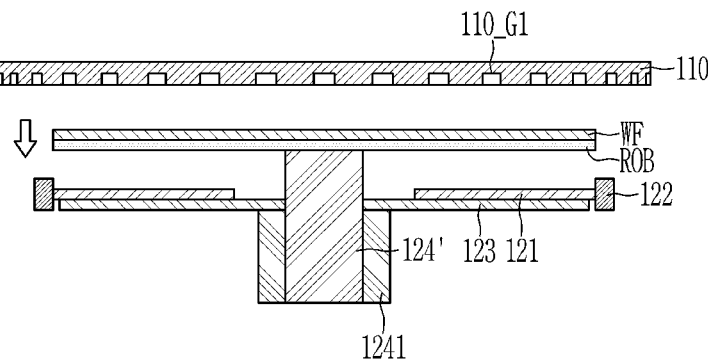

Referring to FIGS. 8C and 9, after the step of loading the wafer WF, the loaded wafer WF may be brought into contact with the membrane 121 disposed in the head part 120 (S930). The loading shaft 124' may move downward to bring the wafer WF, which is loaded onto the loading shaft 124', into contact with the membrane 121.

Figure 8D:
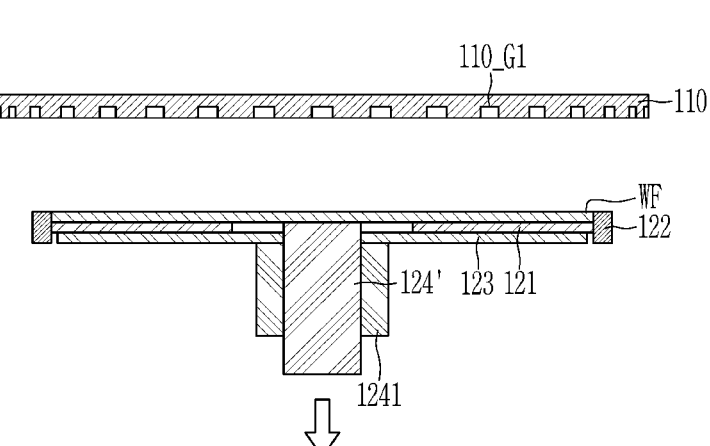

Referring to FIGS. 8D and 9, the method may include a step of supplying slurry onto the wafer WF from the slurry supplier 130 after the step of bringing the loaded wafer WF into contact with the membrane 121 disposed in the head part 120 (S940). The polishing pad 10 may be brought into proximity with the wafer WF, and the slurry may be supplied onto the surface of the wafer WF. For example, the slurry may be supplied directly onto the surface of the wafer WF from the slurry supplier 130, and the polishing process may be performed.

Figure 8E:
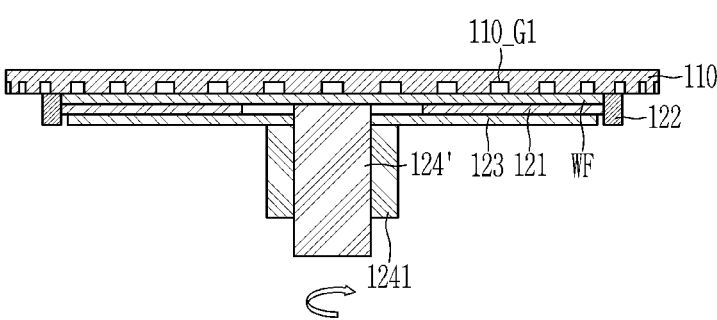

Referring to FIGS. 8E and 9, the method may include a step of polishing the edge portion EG of the wafer WF while rotating the head part 120 in the step of supplying the slurry or after the step of supplying the slurry (S950). The step of polishing the wafer may be performed after the slurry is supplied or at the same time when the slurry is supplied.

In the embodiment, the step of polishing the wafer while rotating the head part 120 may include a step of simultaneously rotating the polishing pad 110 and the head part 120. The detailed description may refer to the description with reference to FIGS. 7A and 7B.

Figure 8F:
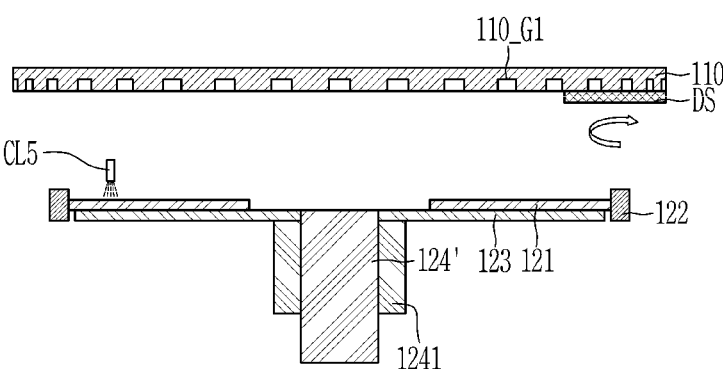

Referring to FIGS. 8F and 9, the method may further include a step of washing the polishing pad 110 and the head part 120 after the step of polishing the edge of the wafer while rotating the head part 120 (S960). In example embodiments, after the step of polishing the edge of the wafer WF while rotating the head part 120, the step of washing the polishing pad 110 and the head part 120 may include a step of separating the completely polished wafer WF, conditioning the polishing pad 110 with a disc DS, and washing the head part 120 to remove impurities in the head part 120. In this case, because the support plate 123 in the head part 120 may include the washing groove 123H, the cleaning head CL5 may directly clean the head part 120, such that it is possible to remove impurities, which are generated during the polishing process, without separately moving the head part 120.

The disc DS may be a member for conditioning the surface of the polishing pad 110. Specifically, the disc DS may polish the surface of the polishing pad 110, thereby maintaining surface roughness of the polishing pad 110 in an optimal state.

In the embodiment, the disc DS may recover or maintain the surface roughness of the polishing pad 110 by polishing the polishing pad 110 in a state in which the wafer WF is being polished by the head part 120 or a state in which the process of polishing the wafer WF is stopped. In the embodiment, the disc DS may be made by attaching polishing particles, e.g., artificial diamond particles to a circular disc made of metal by means of a nickel (Ni) bonding layer. In the embodiment, the disc DS may rotate in a predetermined direction. For example, the disc DS may control roughness of the polishing pad 110 while rotating clockwise.

The above-described polishing apparatus and polishing method may be used to manufacture semiconductor devices including logic devices and memory devices, and further processes may be performed on the semiconductor substrate W to form the semiconductor devices. For example, additional conductive and insulating layers may be deposited on the semiconductor substrate W to form a plurality of semiconductor chips, and the semiconductor chips may then be singulated, packaged on a package substrate, and encapsulated by an encapsulant to form a semiconductor package. The semiconductor devices may include finFET, DRAM, VNAND, etc. The semiconductor devices may be applied in various systems, such as a computing systems.

The present disclosure is not limited to the implements and/or embodiments disclosed above but will be implemented in various different forms, and those skilled in the art will understand that the present disclosure may be implemented in any other specific form without changing the technical spirit or the essential feature of the present disclosure. Therefore, it should be understood that the above-described implements and/or embodiments are illustrative in all aspects and do not limit the present disclosure.

DESCRIPTION OF SYMBOLS 100, 100', 100", 100': Chemical mechanical polishing apparatus
110, 110', 110": Polishing pad
110_G1, 110_G1', 110_G1", 110_G1", 110_G1", 110_G1": First groove
110_G2: Second groove
120, 120', 120", 120", 120", 120": Head part (substrate support)
121, 121', 121": Membrane
121H: Partition wall
122: Slip prevention ring
123: Support plate
123H: Washing groove
124: Rotating shaft
124': Loading shaft
1241: Support ring
124H: Partition wall
130: Slurry supply

130S: Slurry
140: Fixing support
CL1, CL2, CL3, CL4, CL5: Cleaning heads
DS: Disc
EG: Edge portion
PT: Polishing flattener
ROB: Robot
WF: Wafer While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A chemical mechanical polishing apparatus comprising:
   a polishing pad having a hollow cylindrical shape and comprising a plurality of first grooves disposed at an edge of the polishing pad and arranged in a circumferential direction;
   a substrate support positioned below the polishing pad and comprising an edge portion that adjoins the plurality of first grooves, the substrate support being configured to mount a wafer; and
   a slurry supplier positioned above the wafer and configured to supply slurry to the wafer,
   wherein the polishing pad is centered over the substrate support and has a diameter larger than a diameter of the wafer.

2. The chemical mechanical polishing apparatus of claim 1, wherein:
   the substrate support comprises a membrane positioned below the wafer and configured to come into contact with the wafer;
   a slip prevention ring configured to support the wafer being in contact with the membrane;
   a support plate on which the membrane is positioned; and
   a rotating shaft configured to rotate the substrate support.

3. The chemical mechanical polishing apparatus of claim 2, wherein the support plate comprises at least one washing groove provided at an edge thereof.

4. The chemical mechanical polishing apparatus of claim 3, wherein the support plate includes a plurality of washing grooves, and the plurality of washing grooves are disposed at different intervals in a direction in which the substrate support rotates.

5. The chemical mechanical polishing apparatus of claim 1, wherein the polishing pad comprises at least one second groove having a larger width than each of the plurality of first grooves.

6. The chemical mechanical polishing apparatus of claim 1, wherein at least some of the plurality of first grooves are arranged at different intervals in the circumferential direction.

7. The chemical mechanical polishing apparatus of claim 1, wherein in each of the plurality of first grooves, a ratio of a length in the circumferential direction to a length in a direction perpendicular to the circumferential direction is 0.1 to 1.0.

8. The chemical mechanical polishing apparatus of claim 1, wherein the polishing pad comprises a fixing support.

9. The chemical mechanical polishing apparatus of claim 1, further comprising:
   a polishing flattener disposed on the polishing pad and configured to fix the polishing pad.

10. The chemical mechanical polishing apparatus of claim 9, wherein the polishing flattener comprises a fixing support.

11. The chemical mechanical polishing apparatus of claim 1, wherein the slurry supplier supplies the slurry to the wafer, and the slurry is supplied to the edge portion of the wafer by a centrifugal force generated by a rotation of the substrate support.

12. The chemical mechanical polishing apparatus of claim 1, wherein the slurry supplier supplies the slurry to the wafer at a position located at a radial distance that is at least 30% of a radius of the wafer in a direction from the center of the wafer to an edge of the wafer.

13. A chemical mechanical polishing apparatus comprising:
   a polishing flattener;
   a polishing pad disposed below the polishing flattener and having a hollow cylindrical shape, the polishing pad comprising a plurality of first grooves disposed at an edge of the polishing pad and arranged in a circumferential direction;
   a substrate support positioned below the polishing pad and comprising an edge portion that adjoins the plurality of first grooves, the substrate support being configured to mount a wafer;
   a slurry supplier positioned above the wafer and configured to supply slurry to the wafer; and
   a fixing support configured to fix the polishing flattener,
   wherein the substrate support comprises: a membrane positioned below the wafer and configured to come into contact with the wafer; a slip prevention ring configured to support the wafer being in contact with the membrane; a support plate on which the membrane is positioned; and a rotating shaft configured to rotate the substrate support, and
   wherein the polishing pad is centered over the substrate support and has a diameter larger than a diameter of the wafer.

14. The chemical mechanical polishing apparatus of claim 13, wherein the membrane is disposed at an edge portion of the wafer.

15. The chemical mechanical polishing apparatus of claim 14, wherein the membrane comprises at least one partition wall provided in the form of a concentric circle.

16. The chemical mechanical polishing apparatus of claim 13,
   wherein the polishing pad having the hollow cylindrical shape comprises a hollow portion, and
   wherein the slurry supplier is disposed above the hollow portion of the polishing pad.

17. A method of controlling a chemical mechanical polishing apparatus, comprising:
   preparing a substrate support on which no wafer is mounted and preparing a polishing pad having a hollow shape and including a plurality of first grooves disposed at an edge of the polishing pad and arranged in a circumferential direction;
   loading a wafer onto a loading shaft configured to be movable vertically in the substrate support;
   bringing the loaded wafer into contact with a membrane disposed in the substrate support;
   supplying slurry onto the wafer from a slurry supplier; and
   polishing an edge of the wafer while rotating the substrate support.

18. The method of controlling the chemical mechanical polishing apparatus of claim 17, further comprising:

washing the polishing pad and the substrate support after the polishing of the edge of the wafer while rotating the substrate support, wherein the washing of the polishing pad and the substrate support comprises separating the polished wafer, conditioning the polishing pad with a disc, and removing impurities in the substrate support.

19. The method of controlling the chemical mechanical polishing apparatus of claim 17, wherein the loading of the wafer is performed by a robot configured to transfer the wafer.

20. The method of controlling the chemical mechanical polishing apparatus of claim 17, wherein the polishing of the edge of the wafer while rotating the substrate support comprises simultaneously rotating the polishing pad and the substrate support.

\* \* \* \* \*